United States Patent
Hsia et al.

(10) Patent No.: US 6,562,724 B1
(45) Date of Patent: May 13, 2003

(54) SELF-ALIGNED STACK FORMATION

(75) Inventors: Steve Hsia, Plano, TX (US); Yin Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 542 days.

(21) Appl. No.: 09/089,795

(22) Filed: Jun. 3, 1998

Related U.S. Application Data

(60) Provisional application No. 60/049,093, filed on Jun. 9, 1997.

(51) Int. Cl.$^7$ ............................................ H01L 21/302
(52) U.S. Cl. ..................... 438/735; 438/736; 438/745; 438/756
(58) Field of Search ................ 438/647, 755, 438/721, 719, 756, 745, 736, 735

(56) References Cited

U.S. PATENT DOCUMENTS

| | | | | |
|---|---|---|---|---|
| 4,778,563 A | * | 10/1988 | Stone | 438/714 |
| 4,863,559 A | * | 9/1989 | Douglas | 438/709 |
| 5,387,535 A | * | 2/1995 | Wilmsmeyer | 438/621 |
| 5,576,244 A | * | 11/1996 | Hayashi et al. | 438/301 |
| 5,591,301 A | * | 1/1997 | Grewal | 438/729 |
| 5,654,240 A | * | 8/1997 | Lee et al. | 438/647 |

* cited by examiner

*Primary Examiner*—Benjamin L. Utech
*Assistant Examiner*—Binh X. Tran
(74) *Attorney, Agent, or Firm*—Jacqueline J. Garner; W. James Brady, III; Frederick J. Telecky, Jr.

(57) ABSTRACT

A method to simplify the polycide gate structure fabrication processes by using a hardmask 240 to define a pattern of siliciding 260 a silicon layer 230, and then using the silicide 260 to mask removal of the unreacted silicon 220 and 230 in locations where the hardmask 240 had been present. The metal silicide 260 formed in the exposed silicon regions 220 and 230 functions as a self-aligned mask against the silicon 220 and 230 etching. By using a selective etching process between the silicon 220 and 230 and the silicide 260, the silicon 220 and 230 can be etched down to the gate oxide 210 to form the polycide (silicide/polysilicon) gate. The polycide gate formed by this method is particularly advantageous in DRAM applications, but can also be used as a MOS gate in a transistor.

7 Claims, 2 Drawing Sheets

US 6,562,724 B1

SELF-ALIGNED STACK FORMATION

This application claims priority under 35 USC §119 (e)(1) of provisional application No. 60/049,093, filed Jun. 9, 1997.

BACKGROUND AND SUMMARY OF THE INVENTION

The present invention relates to integrated circuit polycide gate structures and fabrication methods.

Background Gate Structures

Patterned multi-layer structures, such as those used for gate structures ("word lines") for dynamic random access memory (DRAM) devices, can be fabricated using the polycide process. As shown in prior art FIG. 3, this process typically consists of blanket deposition of a polysilicon layer 310 on the gate oxide 300, followed by the formation of a low resistivity layer 320, typically a metal silicide such as tungsten silicide (WSi2). This layer can be formed either by direct deposition or by metal deposition followed by a reaction anneal. Subsequently, a dielectric layer 330 (typically silicon nitride, or silicon dioxide) is deposited over the metal silicide layer. The multi-layer structures are then patterned, using a photoresist, and etched, typically to form narrow lines.

One difficulty with gate stack etching is that some topography is present, since with many conventional isolation technologies the gate stack will be higher atop field oxides than on the active (moat) areas. Thus, a substantial amount of overetch is required to fully clear the gate stack from the areas to be etched.

In addition, for complicated DRAM transistor gate stacks, conventional etches have lower inter-layer selectivities and lower etch uniformity. These etches will only work on stacks with a thick polysilicon layer and minimal wafer topography where it is possible to stop in the polysilicon layer before exposing and removing the gate oxide. Furthermore, two etch steps need to be performed: one to remove the metal silicide and one to remove the polysilicon. Conventional etches also do not have the profile control required to etch gates with lengths of 0.25 microns and below.

Polycide Structures and Methods

The present application discloses a method to simplify conductive stack fabrication processes by using a hardmask to define a pattern for forming a reaction product, such as a silicide, with the lower conductive layers, and then using the reaction product as a self-aligned mask during a selective etch of the rest of the stack. This method of forming a reverse pattern is particularly advantageous in DRAM applications, to form the gate, but can also be used in other applications, such as to form MOS gates.

Advantages of the disclosed methods include:

avoids etching both the metal silicide and polysilicon layers;

formation of metal silicide by the disclosed process produces a self-aligned mask of the polysilicon layer; and no photoresist is needed in the etching chamber.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview

Figure 1:
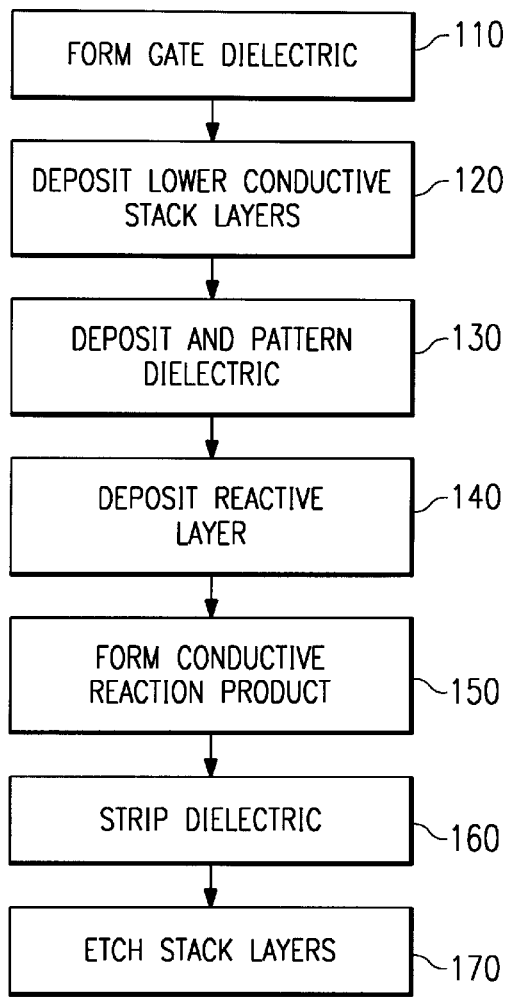
FIG. 1 shows a process flow for fabricating polycide gate structures in accordance with preferred embodiments of the present invention.
Figure 3:
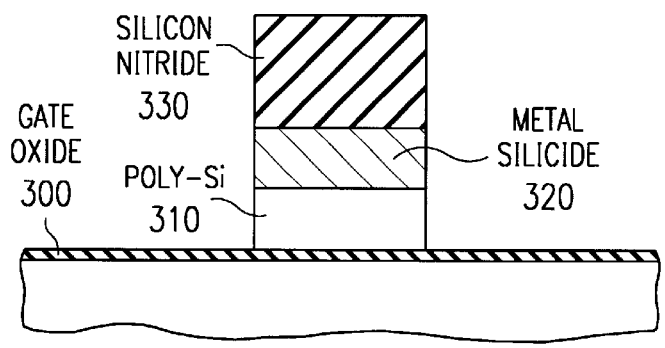
FIG. 3 shows a cross-sectional view of a prior art gate structure.

FIG. 1 demonstrates the process involved in fabricating a gate structure in accordance with embodiments of the present invention, and FIGS. 2A–2D illustrate the structures seen during formation of a polycide gate using the disclosed process. First, a thin gate dielectric layer 210 is formed (step 110) over the semiconductor substrate 200, followed by the deposition of the conductive stack layer, which is non-monocrystalline semiconductor (step 120). In the presently preferred embodiment, the conductive stack is two conductive layers, 220 and 230, which have different microstructures (such as amorphous silicon and polysilicon). In less preferred embodiments, these two layers can be replaced by a single layer.

Figure 2A:
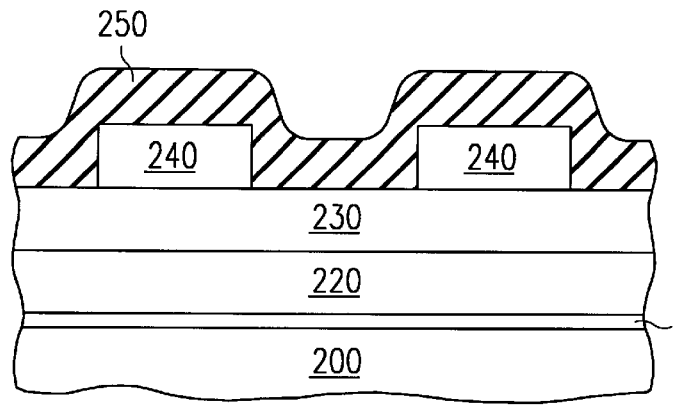
FIGS. 2A–2D schematically illustrate the formation of a polycide gate using disclosed methods of the present invention.
Figure 2B:
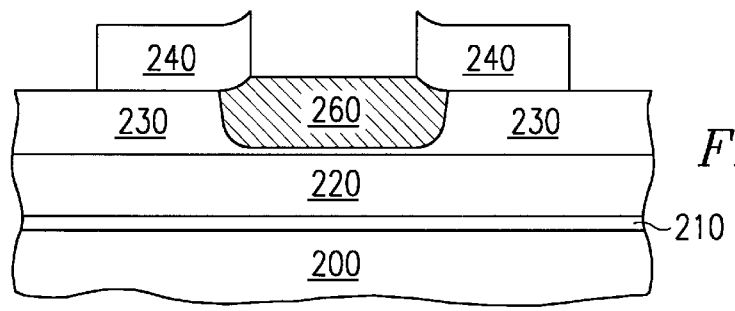

Subsequently, a hardmask material 240, such as silicon dioxide, is deposited and reverse patterned (step 130), as shown in FIG. 2A, to expose locations in the conductive stack layer 230 where a conductive reaction product, such as a metal silicide, will be formed. Layer 250, which can be, for example, a refractory metal, is then blanket deposited (step 140), followed by a reaction anneal to form the conductive reaction product 260, e.g. a metal silicide (step 150), in areas not covered by the hardmask material 240, shown in FIG. 2B.

Figure 2C:
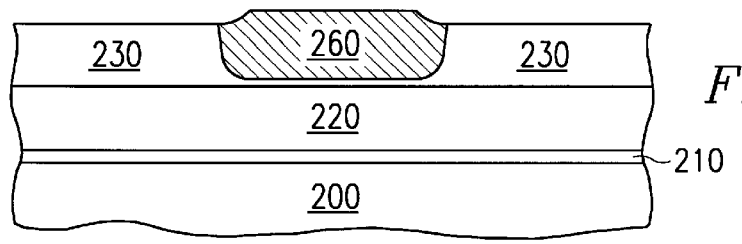
Figure 2D:
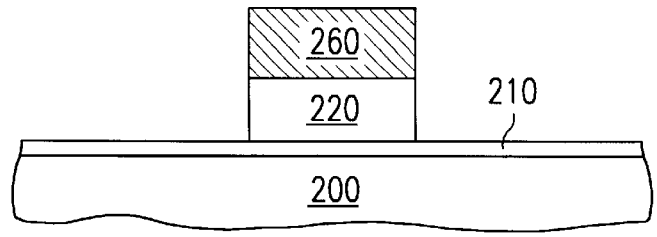

Thereafter, the hardmask material 240 is stripped (step 160), as can be seen in FIG. 2C, allowing the conductive reaction product 260 to serve as a mask for the subsequent anisotropic patterning of the rest of the stack (step 170). The etch chosen is selective to the conductive reaction product 260, so that areas not covered by it are removed to define the desired structure, shown in FIG. 2D. Advantageously, by forming stack structures with the process disclosed herein, no photoresist needs to be used in the etch chamber. Therefore, the formation of polymers during the stack etch is greatly reduced.

First Polycide Process Embodiment: Amorphous Silicon over Polysilicon

In the presently preferred embodiment, after formation of the gate oxide, a polysilicon layer is deposited, preferably by low pressure CVD (LPCVD), with a thickness in the range of 50–100 nm (preferably 70 nm). The second stack layer is amorphous silicon which has a thickness of around 70 nm.

Silicon dioxide is then deposited and reverse patterned for the hardmask. A layer of titanium is then blanket deposited, followed by a rapid thermal anneal, typically at 800 degrees C. for 30 to 60 seconds, to form titanium silicide in areas not covered by the oxide. After the anneal, the amorphous silicon layer crystallizes, which results in two polysilicon layers.

The titanium silicide formed has a thickness approximately the thickness of the original amorphous silicon layer (e.g. 70 nm). In addition, the diffusion extends laterally to form about 10 to 20 nm of titanium silicide under the oxide. Furthermore, some silicon diffuses into the titanium, which will slightly push up the hardmask layer. The thickness of the titanium silicide can be controlled by the temperature and duration of the anneal. For thicker silicides, the duration of the anneal must be greatly increased since the diffusion process is self-limiting.

Thereafter, the oxide is stripped and titanium silicide serves as a mask for the subsequent anisotropic patterning of the stack, typically with a reactive ion etch of the polysilicon layers, selective to the titanium silicide, e.g. by using a chlorine-based chemistry. This removes areas not covered by the titanium silicide and defines the desired structure.

Processing then continues with conventional steps to complete fabrication, e.g. smiling oxidation, sidewall spacer formation, deposition and planarization of further interlevel dielectric, via patterning, second metal deposition and etch, protective overcoat deposition, etching contact pad apertures, etc.

Second Polycide Process Embodiment: Additional Polysilicon Layer

In an alternative and less preferred embodiment, an additional layer of polysilicon, having a thickness of e.g. around 70 nm, can be deposited over an underlying layer of polysilicon, which also has a thickness of e.g. around 70 nm. This additional layer of polysilicon reacts with the metal to form areas of metal silicide, which are used as masks during the etching of the polysilicon layers to form the polycide gate structures.

Third Polycide Process Embodiment: Amorphous Si over Poly-SiGe

In an alternative embodiment, a layer of poly-SiGe can be deposited prior to the amorphous silicon layer. This permits the work function seen by the transistor channel to be optimized using a narrower band gap. Otherwise processing conditions are similar to the amorphous over polysilicon embodiment.

Fourth Polycide Process Embodiment: Barrier Layer

In an alternative embodiment, a diffusion barrier layer (e.g. 5 nm of TiN, TiAlN, TiSiN, or WN) can be deposited between the polysilicon and amorphous silicon (or between two polysilicon layers) in order to prevent the diffusion of silicon into the silicide, and thus to reduce the sheet resistance. However, a different etch chemistry is preferably used to clear the barrier layer prior to etching the bottom polysilicon layer.

Alternative Metal Embodiment: Tungsten

In another embodiment, a layer of tungsten can be deposited over the patterned hardmask layer and exposed portions of the polysilicon layers to form a layer of tungsten silicide in the exposed portions when the structure is annealed. The tungsten silicide can then be used as a self-aligned mask during the etching of the polysilicon layers.

Alternative Metal Embodiment: Cobalt

In another embodiment, a layer of cobalt can be deposited over the patterned hardmask layer and exposed portions of the polysilicon layers to form a layer of cobalt silicide in the exposed portions when the structure is annealed. The cobalt silicide can then be used as a self-aligned mask during the etching of the polysilicon layers.

Alternative Metal Embodiment: Nickel

In another embodiment, a layer of nickel can be deposited over the patterned hardmask layer and exposed portions of the polysilicon layers to form a layer of nickel silicide in the exposed portions when the structure is annealed. The nickel silicide can then be used as a self-aligned mask during the etching of the polysilicon layers.

Alternative Siliciding Embodiment: Ion Implantation

Alternatively, prior to depositing the metal layer, an ion implantation step can be performed to begin the formation of the metal silicide. This implantation step allows for more vertical metal silicide formation. However, this requires an additional processing step.

Alternative Hardmask Embodiment: Silicon Nitride

Alternatively, a layer of silicon nitride can be deposited and reverse patterned to expose portions of the amorphous silicon and polysilicon layers where the silicide will be formed.

Alternative Hardmask Embodiment: Silicon Oxynitride

Alternatively, a layer of silicon oxynitride can be deposited and reverse patterned to expose portions of the amorphous silicon and polysilicon layers where the silicide will be formed.

According to a disclosed class of innovative embodiments, there is provided: A method of fabricating a patterned multi-layer structure, comprising the steps of: a) depositing a blanket first layer over a patterned hardmask layer which overlies a second layer, said second layer comprising a non-monocrystalline semiconductor; b) annealing said multi-layer structure to form a conductive reaction product of said first and said second layers in portions of said second layer which are not covered by said hardmask layer, and removing unreacted portions of said first layer; c) stripping said hardmask layer; and d) anisotropically and selectively etching said second layer with respect to said conductive reaction product to remove portions of said second layer which are not covered by said conductive reaction product to form said patterned multi-layer structure.

According to another disclosed class of innovative embodiments, there is provided: A method of fabricating a polycide gate structure, comprising the steps of: a) depositing a blanket metal layer over a patterned hardmask layer which overlies a non-monocrystalline semiconductor layer, said non-monocrystalline semiconductor layer overlying a gate dielectric which overlies a crystalline semiconductor; b) annealing said gate structure to form a metal silicide in portions of said non-monocrystalline semiconductor layer which are not covered by said hardmask layer, and removing unreacted portions of said metal layer; c) stripping said hardmask layer; and d) anisotropically etching said non-monocrystalline semiconductor layer in areas not covered by said metal silicide to stop on said gate dielectric.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While the inventions have been described with primary reference to a single-poly process, it will be readily recognized that these inventions can also be applied to process with two, three, or more layers of polysilicon or polycide.

Of course a variety of structures can be used to implement the polysilicon or polycide gate. For example, the silicon layers 220 and 230 may be a single layer, or the two layers may be separated by a barrier layer, or other specific stack layer can be used which would allow a silicide to be formed in the upper portion. In addition, a layer of polycrystalline silicon/germanium can be used instead of the polysilicon of the presently preferred embodiment.

Of course, the specific etch chemistries, layer compositions, and layer thicknesses given are merely illustrative, and do not by any means delimit the scope of the claimed inventions.

What is claimed is:

1. A method for fabricating an integrated circuit, comprising the steps of:

forming a conductive layer over a semiconductor body;

forming a patterned hardmask over said conductive layer;

depositing a layer of refractory metal over said patterned hardmask and said conductive layer; reacting a portion of said refractory metal layer with said conductive layer to form a silicide at a surface of said conductive layer except under said patterned hardmask;

removing an unreacted portion of said refractory metal layer;

removing said patterned hardmask;

selectively etching said conductive layer using said silicide as a mask.

2. The method of claim 1, wherein said conductive layer comprises first and second polysilicon layers.

3. The method of claim 1, wherein said conductive layer comprises a layer of amorphous silicon overlying a polysilicon layer.

4. The method of claim 3, wherein said conductive layer comprises a diffusion barrier layer between said amorphous silicon layer and said polysilicon layer.

5. The method of claim 1, wherein said patterned hardmask comprises silicon dioxide.

6. The method of claim 1, wherein said refractory metal layer comprises titanium.

7. A method for fabricating an integrated circuit, comprising the steps of:

forming a conductive layer over a semiconductor body;

forming a reverse patterned hardmask over said conductive layer;

depositing a layer of refractory metal over said reverse patterned hardmask and said conductive layer;

reacting a portion of said refractory metal layer with said conductive layer to form a silicide at a surface of said conductive layer except under said reverse patterned hardmask;

removing an unreacted portion of said refractory metal layer;

removing said reverse patterned hardmask;

selectively etching said conductive layer using said suicide as a mask.

* * * * *